United States Patent
Wu et al.

(10) Patent No.: US 9,194,045 B2
(45) Date of Patent: Nov. 24, 2015

(54) CONTINUOUS PLASMA AND RF BIAS TO REGULATE DAMAGE IN A SUBSTRATE PROCESSING SYSTEM

(71) Applicant: Novellus Systems, Inc., San Jose, CA (US)

(72) Inventors: Liqi Wu, Santa Clara, CA (US); Huatan Qiu, San Jose, CA (US); Yung Yi Lee, Sunnyvale, CA (US)

(73) Assignee: Novellus Systems, Inc., San Jose, CA (US)

( * ) Notice: Subject to any disclaimer, the term of this patent is extended or adjusted under 35 U.S.C. 154(b) by 282 days.

(21) Appl. No.: 13/854,497

(22) Filed: Apr. 1, 2013

(65) Prior Publication Data

US 2013/0260057 A1 Oct. 3, 2013

Related U.S. Application Data

(60) Provisional application No. 61/619,617, filed on Apr. 3, 2012.

(51) Int. Cl.
| | |
|---|---|
| *C23C 16/503* | (2006.01) |
| *C23C 16/505* | (2006.01) |
| *C23C 14/04* | (2006.01) |
| *C23C 14/34* | (2006.01) |
| *C23C 14/35* | (2006.01) |
| *H01J 37/32* | (2006.01) |
| *H01L 21/285* | (2006.01) |
| *H01L 21/768* | (2006.01) |

(52) U.S. Cl.
CPC .............. *C23C 16/505* (2013.01); *C23C 14/046* (2013.01); *C23C 14/345* (2013.01); *C23C 14/35* (2013.01); *H01J 37/32* (2013.01); *H01J 37/32706* (2013.01); *H01L 21/2855* (2013.01); *H01L 21/76877* (2013.01)

(58) Field of Classification Search
CPC ............................ C23C 16/503; C23C 16/505
See application file for complete search history.

(56) References Cited

U.S. PATENT DOCUMENTS

| | | | |
|---|---|---|---|
| 5,242,561 A | 9/1993 | Sato | |
| 5,380,566 A | 1/1995 | Robertson et al. | |

(Continued)

FOREIGN PATENT DOCUMENTS

| | | |
|---|---|---|
| EP | 0399676 A1 | 11/1990 |
| JP | 07-335570 | 12/1995 |

OTHER PUBLICATIONS

Yin, Y., et al., "The origins of self-bias on dielectric substrates in RF plasma processing". Surface and Coatings Technology 200 (2006) 3670-3674.*

(Continued)

*Primary Examiner* — Bret Chen

(57) ABSTRACT

Methods of processing a substrate include supplying process gas to a processing chamber including the substrate. Plasma is created in the processing chamber. After performing a first substrate processing step, the plasma is maintained in the processing chamber and at least one operating parameter is adjusted. The operating parameters may include RF bias to a pedestal, a plasma voltage bias, a gas admixture, a gas flow, a gas pressure, an etch to deposition (E/D) ratio and/or combinations thereof. One or more additional substrate processing steps are performed without an interruption in the plasma between the first substrate processing step and the one or more additional substrate processing steps.

30 Claims, 7 Drawing Sheets

(56) References Cited

U.S. PATENT DOCUMENTS

| | | | |
|---|---|---|---|
| 6,383,576 B1* | 5/2002 | Matsuyama | 427/585 |
| 6,821,577 B2* | 11/2004 | Rossman | 427/569 |
| 6,905,737 B2 | 6/2005 | Verplancken et al. | |
| 7,011,866 B1* | 3/2006 | Yamanaka et al. | 427/255.28 |
| 7,871,676 B2 | 1/2011 | Chiang et al. | |
| 8,129,290 B2 | 3/2012 | Balseanu et al. | |
| 2002/0076490 A1* | 6/2002 | Chiang et al. | 427/248.1 |
| 2002/0168553 A1 | 11/2002 | Lee et al. | |
| 2004/0092132 A1 | 5/2004 | Doan et al. | |
| 2005/0255257 A1* | 11/2005 | Choi et al. | 427/585 |
| 2006/0210723 A1 | 9/2006 | Ishizaka | |
| 2007/0026540 A1 | 2/2007 | Nooten et al. | |
| 2007/0245962 A1 | 10/2007 | Choi | |
| 2008/0241419 A1 | 10/2008 | Chua | |
| 2008/0241420 A1* | 10/2008 | Dhindsa et al. | 427/569 |
| 2009/0041950 A1 | 2/2009 | Mizuno et al. | |
| 2009/0162698 A1* | 6/2009 | Fukuzawa et al. | 428/811.2 |
| 2010/0068881 A1* | 3/2010 | Kang et al. | 438/653 |
| 2011/0048924 A1* | 3/2011 | Freeborn et al. | 204/192.1 |
| 2011/0151142 A1 | 6/2011 | Seamons et al. | |
| 2011/0256726 A1* | 10/2011 | LaVoie et al. | 438/702 |
| 2011/0256734 A1 | 10/2011 | Hausmann et al. | |
| 2012/0028454 A1 | 2/2012 | Swaminathan et al. | |
| 2012/0171855 A1* | 7/2012 | Ward et al. | 438/592 |
| 2015/0110968 A1 | 4/2015 | LaVoie | |

OTHER PUBLICATIONS

Schaepkens, M., et al., "Effects of radio frequency bias frequency and radio frequency bias pulsing on SiO2 feature etching in inductively coupled fluorocarbons plasmas". J. Vac. Sci. Technol. B 18(2), Mar./Apr. 2000, pp. 856-863.*

Chandhok, Manish, et al., "Modeling the Pressure Dependence of DC Bias Voltage in Asymmetric, Capacitive RF Sheaths". IEEE Transactions on Plasma Science, vol. 26, No. 2, Apr. 1998, pp. 181-189.*

Klimes, W., e al., "Gap filling with High Current pulsed arc evaporation : influence of deposition parameters". MAM-97—Materials for Avanced Metallization, Posters session 1, p. 136. Abstract Only.*

Notificaiton of Transmittal of the International Search Report and Written Opinion of the International Searching Authority, International Application No. PCT/US2013/034906, dated Apr. 2, 2013, 13 pages.

http://photonicswiki.org/index.php?title=Atomic_Layer_Deposition_ALD; pp. 1-6; Jul. 13, 2009.

http://www.tue.nl/universiten/faculteiten/faculteit-tn/onderzoek/onderzoekscluster-plasmas..., "Atomic Layer Deposition", University of Technology, 1 page.

* cited by examiner

CONTINUOUS PLASMA AND RF BIAS TO REGULATE DAMAGE IN A SUBSTRATE PROCESSING SYSTEM

CROSS-REFERENCE TO RELATED APPLICATIONS

This application claims the benefit of U.S. Provisional Application No. 61/619,617, filed on Apr. 3, 2012. The entire disclosure of the application referenced above is incorporated herein by reference.

FIELD

The present disclosure relates to systems and methods for processing a substrate, and more specifically to systems and methods for processing a substrate in a substrate processing system with continuous plasma.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Ionized physical vapor deposition (iPVD) processes typically involve multiple, discrete processing steps. Some of the processing steps may involve the use of plasma that is operated with a different RF power and/or a different etch/deposition (E/D) ratio. Currently, the DC plasma is extinguished between each of the steps of an integration stack and re-ignited for a subsequent step.

At the beginning of a processing step, the plasma is struck and becomes stable after a predetermined period. Film that is deposited before the plasma is stable will have low quality, which lowers yield. The amount of time associated with the stabilization of the plasma also lowers substrate throughput.

Some advanced iPVD processes for copper utilize high density plasma to facilitate Cu reflow. Reflow provides high sidewall/bottom Cu coverage and low overhang with minimum or no deposition on the field.

SUMMARY

A method for processing a substrate includes (a) supplying process gas to a processing chamber including a substrate arranged on a pedestal; (b) supplying a first voltage bias to components of the processing chamber to create plasma in the processing chamber; (c) supplying a radio frequency (RF) bias to the pedestal, wherein the RF bias has a first frequency and a first power level; (d) performing a first substrate processing step; (e) after the first substrate processing step, maintaining the plasma in the processing chamber and at least one of: (e1) adjusting the first voltage bias to a second voltage bias that is different than the first voltage bias; (e2) adjusting the first frequency of the RF bias to a second frequency that is different than the first frequency; or (e3) adjusting the first power level of the RF bias to a second power level that is different than the first power level; and (f) performing a second substrate processing step without an interruption in the plasma between the first substrate processing step and the second substrate processing step.

In other features, (e) includes (e1) and at least one of (e2) and (e3). The process gas comprises a first gas admixture supplied at a first flow rate and a first pressure. During (e), at least one of: adjusting the first gas admixture to a second gas admixture that is different than the first gas admixture; adjusting the first flow rate to a second flow rate that is different than the first flow rate; or adjusting the first pressure to a second pressure that is different than the first pressure.

In other features, the method includes performing the first substrate processing step using a first etch to deposition (E/D) ratio. During (e), the method includes adjusting the first E/D ratio to a second E/D ratio that is different than the first E/D ratio. A duration of the first substrate processing step is different than a duration of the second substrate processing step. The first and second substrate processing steps comprise ionized physical vapor deposition (iPVD). The iPVD comprises copper ion reflow.

In other features, (e) includes (e3), one of the first power level and the second power level is equal to zero and the other of the first power level and the second power level is not equal to zero.

A method for processing a substrate includes (a) supplying process gas to a processing chamber including a substrate arranged on a pedestal, wherein the process gas comprises a first gas admixture supplied at a first flow rate and a first pressure; (b) supplying a first voltage bias to components of the processing chamber to create plasma in the processing chamber; (c) performing a first substrate processing step; (d) after the first substrate processing step, maintaining the plasma in the processing chamber and at least one of: (d1) adjusting the first voltage bias to a second voltage bias that is different than the first voltage bias; (d2) adjusting the first gas admixture to a second gas admixture that is different than the first gas admixture; (d3) adjusting the first flow rate to a second flow rate that is different than the first flow rate; or (d4) adjusting the first pressure to a second pressure that is different than the first pressure; and (e) performing a second substrate processing step without an interruption in the plasma between the first substrate processing step and the second substrate processing step.

A method for processing a substrate includes (a) supplying process gas to a processing chamber including a substrate arranged on a pedestal, wherein the process gas comprises a first gas admixture supplied at a first flow rate and a first pressure; (b) supplying a radio frequency (RF) bias to the pedestal, wherein the RF bias has a first frequency and a first power level; (c) generating plasma in the processing chamber; (d) performing a first substrate processing step; (e) after the first substrate processing step, maintaining the plasma in the processing chamber and at least one of: (e1) adjusting the first frequency of the RF bias to a second frequency that is different than the first frequency; (e2) adjusting the first power level of the RF bias to a second power level that is different than the first power level; (e3) adjusting the first gas admixture to a second gas admixture that is different than the first gas admixture; (e4) adjusting the first flow rate to a second flow rate that is different than the first flow rate; or (e5) adjusting the first pressure to a second pressure that is different than the first pressure; and (f) performing a second substrate processing step without an interruption in the plasma between the first substrate processing step and the second substrate processing step.

A method for processing a substrate includes (a) supplying process gas to a processing chamber including a substrate arranged on a pedestal; (b) supplying a first voltage bias to components of the processing chamber to create plasma in the processing chamber; (c) generating plasma in the processing chamber; (d) performing a first substrate processing step using a first etch to deposition (E/D) ratio; (e) after the first substrate processing step, maintaining the plasma in the processing chamber and at least one of: (e1) adjusting the first voltage bias to a second voltage bias that is different than the first voltage bias; or (e2) adjusting the first E/D ratio to a second E/D ratio that is different than the first E/D ratio; and (f) performing a second substrate processing step without an interruption in the plasma between the first substrate processing step and the second substrate processing step.

A method for processing a substrate, comprises (a) supplying process gas to a processing chamber including a substrate arranged on a pedestal, wherein the process gas comprises a gas admixture supplied at a first flow rate and a first pressure; (b) supplying a radio frequency (RF) bias to the pedestal, wherein the RF bias has a first frequency and a first power level; (c) generating plasma in the processing chamber; (d) performing a first substrate processing step using a first etch to deposition (E/D) ratio; (e) after the first substrate processing step, maintaining the plasma in the processing chamber and at least one of: (e1) adjusting the first frequency of the RF bias to a second frequency that is different than the first frequency; (e2) adjusting the first power level of the RF bias to a second power level that is different than the first power level; or (e3) adjusting the first E/D ratio to a second E/D ratio that is different than the first E/D ratio; and (f) performing a second substrate processing step without an interruption in the plasma between the first substrate processing step and the second substrate processing step.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

Figure 1:
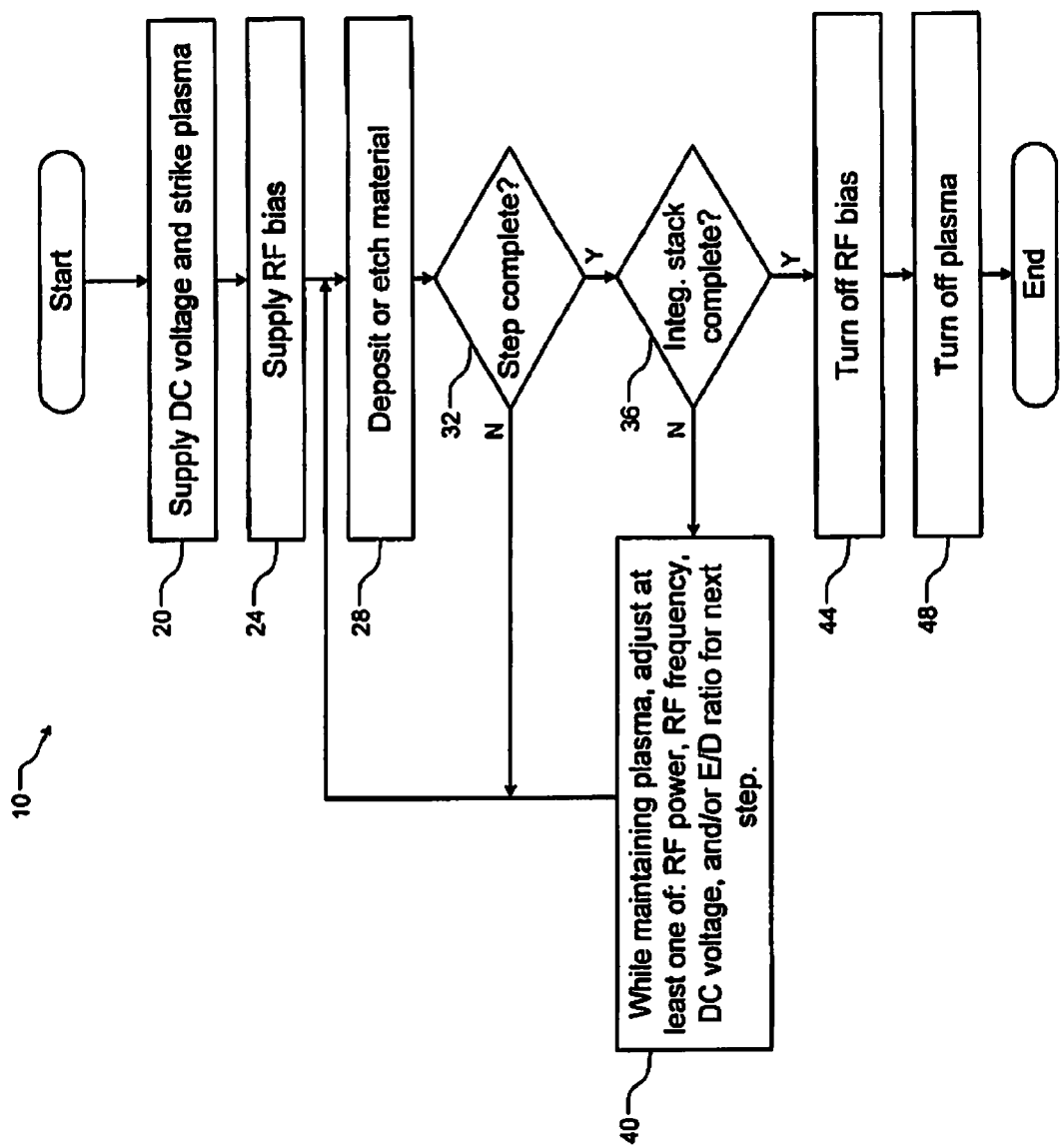
FIG. 1 is a flowchart illustrating an example of a method according to the present disclosure using continuous plasma for multiple steps of an integration stack and using different RF bias or E/D ratio parameters for the steps.

While the present disclosure will be described in the context of ionized physical vapor deposition (iPVD) systems and methods, the present disclosure also applies to plasma deposition processes such as plasma-enhanced chemical vapor deposition (PECVD), plasma-assisted ALD, ion induced ALD (iALD), or any other type of substrate processing system that uses plasma. The present disclosure also applies to iPVD systems that use hollow cathode magnetrons (HCM) or other types of targets or magnetrons.

The present disclosure describes using continuous plasma during multiple steps of an integration stack. Deposition parameters such as RF bias power are adjusted between at least two of the steps without extinguishing the plasma. In some examples, the RF bias power is adjusted between two or more non-zero values during processing of the multiple steps of the integration stack. In other examples, the RF bias power is equal to zero during at least one of the steps.

According to one non-limiting example of the present disclosure, improved results are achieved when copper ion reflow occurs on a clean Ta film surface as opposed to a surface that is coated with Cu or that has formed TaOx due to exposure to ambient conditions between discrete steps. Therefore, the present disclosure describes performing the entire Cu ion reflow process without interruption of the plasma. In some examples, the RF bias power is also maintained at two or more non-zero values during the process. In other examples, the RF bias power is equal to zero during at least one of the steps.

When the ion flow dynamic is stopped (such as when the plasma is stopped between processing steps of an integration stack), the Cu ion flow needs to be re-activated by using high RF power and/or a high E/D ratio after the plasma is struck. Due to the nature of the Cu ion reflow process, high barrier damage tends to occur due to the high RF power and/or E/D ratio. High barrier damage is detrimental to barrier/seed integration, and can increase Cu line resistance, voids and defects.

According to the present disclosure, continuously-on DC plasma ("continuous plasma") with variable RF power is applied to the substrate during substrate processing such as ionized PVD (iPVD) film deposition. In some examples, the RF power is greater than zero during processing steps. In other examples, the RF bias power is equal to zero during at least one of the steps. This approach tends to reduce process damage to barrier and dielectric underlayers and improves feature filling and reduces defects. Using this approach maintains Cu ion reflow capability throughout the whole process. In addition, this approach allows a lower overall RF power and/or a lower E/D ratio to be used while keeping similar ion reflow performance. Cu damage to barrier and dielectric layers can be significantly reduced.

Only a single plasma ignition step is required for multiple processing steps. In some examples, the multiple processing steps comprise an integration stack. As a result of this approach, low quality deposition and potential plasma damage at the beginning of the process are minimized.

The systems and methods described herein improve the ion reflow process in a substrate processing chamber with a DC plasma Hollow Cathode Magnetron (HCM). However, the systems and methods described herein may be used for other types of magnetrons and/or different plasma conditions. For example only, RF or microwave plasma may be used.

During the iPVD Cu process, the plasma is always on and the RF power changes between two or more non-zero values for the processing steps of an integration stack. In other examples, the RF bias power is equal to zero during at least one of the steps. The RF power is tailored to achieve optimal sidewall coverage with minimal barrier/dielectric damage.

A controller may be used to adjust the RF power during the plurality of processing steps. The RF power, duration, and ramp time can be controlled to meet the process requirements. For example only, at the beginning of process, a high RF power process is used to start Cu ion reflow. Then the RF power is reduced without turning off the plasma. The high/low RF process can be alternated to obtain both good ion reflow and minimal damage.

In addition, the substrate temperature typically increases during the process when done without interruption. The higher substrate temperature further facilitates Cu reflow, and therefore the RF power can be further reduced, which lowers damage and saves energy/cost.

The RF power waveform (RF power versus time) during transitions between the plurality of steps may have a variety of profiles. For example, the profile may include saw tooth, monotonically decreasing, monotonically increasing, square pulses with different duty cycles, and/or other profiles. Alternately, the applied RF power may be reduced to zero during part of the ion flow process. In this case, the substrate would be at the self-bias potential.

While the RF bias may be operated at a fixed frequency (such as 13.56 MHz) during operation, the frequency of the RF bias may be varied during the uninterrupted ion flow process. Alternately, the RF bias may be operated at multiple frequencies during a given step.

While in some examples the continuous plasma is maintained with fixed plasma power, gas flow, gas pressure and gas admixture conditions, variable plasma power, gas admixture (Ar or Ar/$H_2$ or Ar/He, etc), gas flow and/or gas pressure may be used.

Referring now to FIG. 1, an example of a method 10 for depositing material using continuous plasma is shown. At 20, DC voltage is applied and the plasma is struck. At 24, an RF bias is supplied to the pedestal. At 28, material is deposited or etched in one of a plurality of steps of an integration stack. At 32 and 36, if the step is complete and the integration stack is not complete, the parameters are adjusted for the next step while maintaining the plasma at 40. For example only, the RF bias may be reduced for a predetermined period and then, after the predetermined period, the RF bias may be increased for another deposition or etch step. Alternately, at least one of RF power, RF frequency, DC voltage and/or etch to deposition (E/D) ratio may be adjusted for the next step. Additional steps may be performed. When the integration stack is complete at 36, the RF bias is turned off at 44 and the plasma is turned off at 48.

Figure 2:
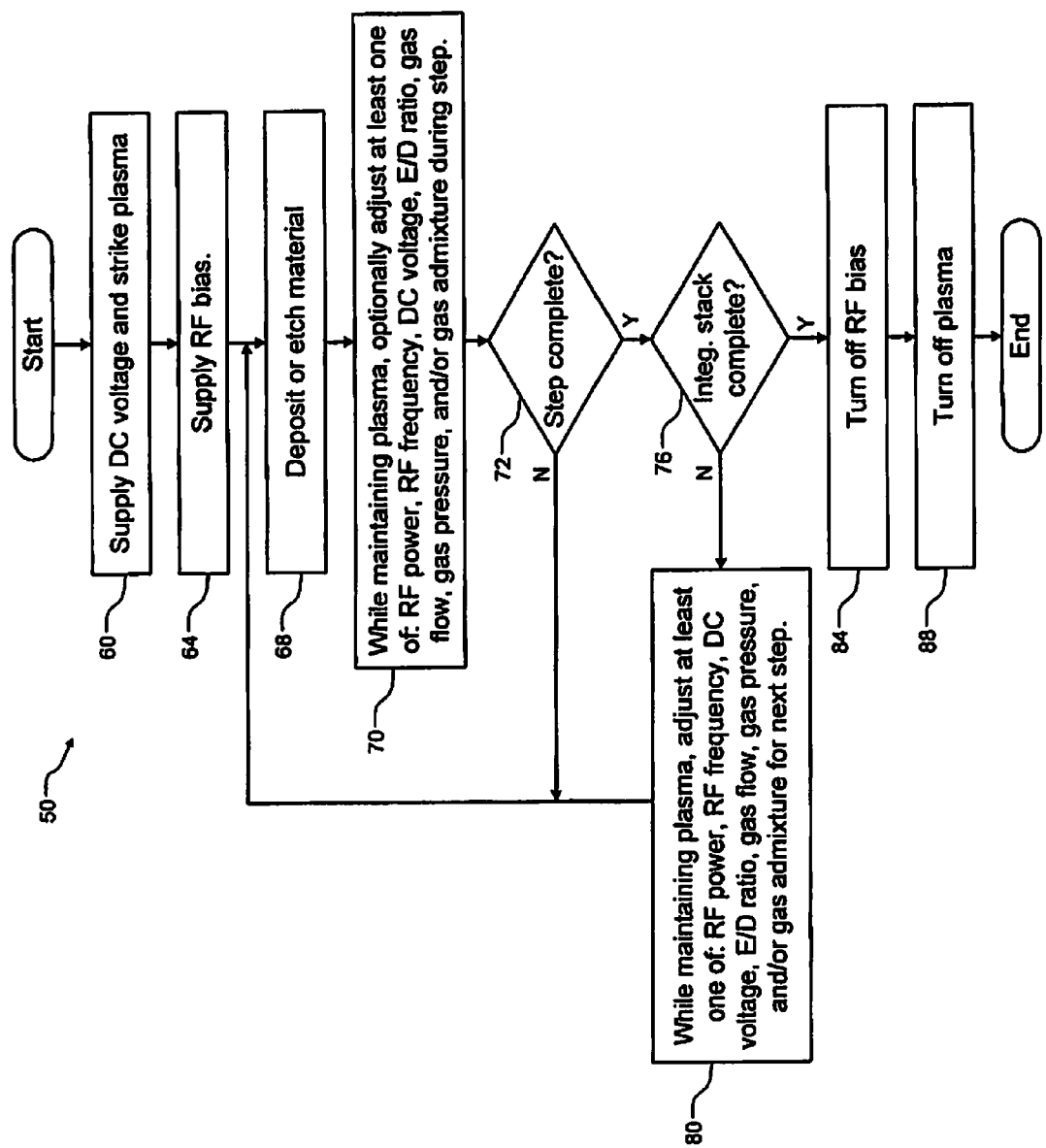
FIG. 2 is a flowchart illustrating another example of a method according to the present disclosure using continuous plasma for multiple steps of an integration stack and using different RF bias or E/D ratio parameters and changes to one or more operating parameters during a step.

Referring now to FIG. 2, an example of a method 50 for depositing material using continuous plasma is shown. At 60, DC voltage is applied and the plasma is struck. At 64, an RF bias is supplied to the pedestal. At 68, material is deposited or etched in one of a plurality of steps of an integration stack. At 70, while maintaining the plasma, at least one of the RF power, RF frequency, DC voltage. E/D ratio, gas flow, gas pressure or gas admixture is optionally adjusted at 70.

At 72 and 76, if the step is complete and the integration stack is not complete, one or more parameters are adjusted while maintaining the plasma at 80. For example only, the RF bias may be reduced for a predetermined period and then, after the predetermined period, the RF bias may be increased for another deposition or etch step. Alternately, at least one of the RF power, RF frequency, DC voltage E/D ratio, gas flow, gas pressure or gas admixture is optionally adjusted for the next step. Additional steps may be performed. When the integration stack is complete at 76, the RF bias is turned off at 84 and the plasma is turned off at 88.

Figure 3:
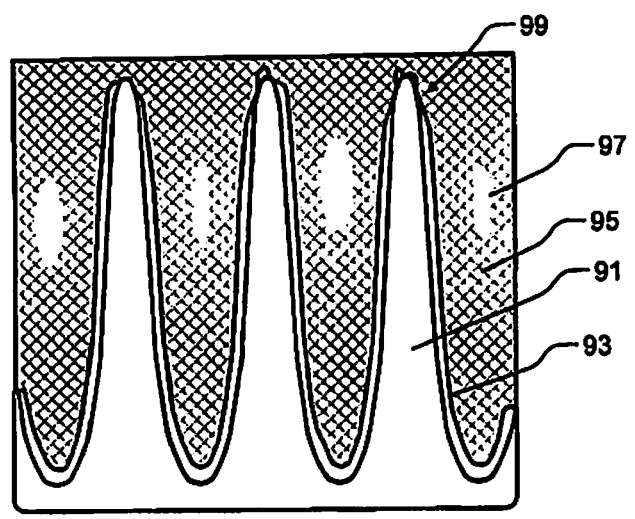
FIG. 3 illustrates an example of deposition according to the prior art with discontinuous plasma between multiple processing steps of an integration stack.
Figure 4:
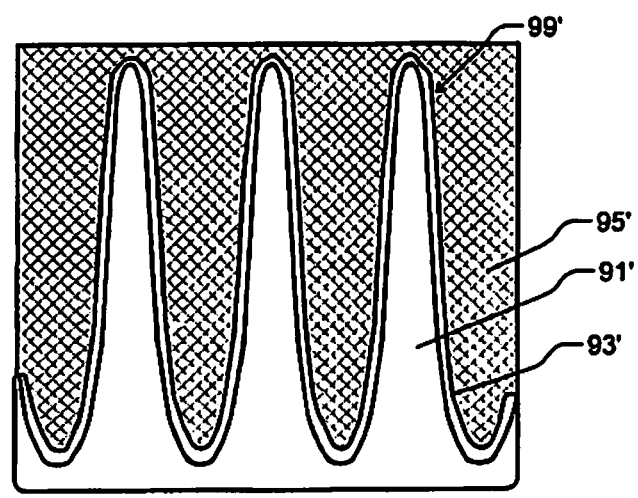
FIG. 4 illustrates an example of deposition according to the present disclosure using continuous plasma for multiple processing steps of an integration stack.

Referring now to FIGS. 3 and 4, integration results are shown between a regular process (discontinuous plasma) and continuous plasma processes. In FIG. 3, Cu filling is shown for high aspect ratio trenches by a multistep process with plasma interruption between steps. Voids are seen at a middle height of the trench as a result of less than desired Cu reflow. A field barrier is also damaged.

For example in FIG. 3, a four step process is used with discontinuous plasma. In a first step, 80-100 Angstroms are deposited with an RF bias from 200-400 Watts (W). In a second step, 60-80 Angstroms are deposited with an RF bias from 100-200 W. In a third step, 60-80 Angstroms are deposited with an RF bias from 200-400 W. In a fourth step, 60-80 Angstroms are deposited with an RF bias from 100-200 W. The four steps may be repeated. FIG. 3 illustrates the results of the discontinuous approach. A dielectric layer 91 has a barrier layer 93 deposited thereon. Copper 95 is deposited with voids 97. Damage to the barrier layer 93 (identified at 99) occurs.

In FIG. 4, an analogous process is shown with continuous plasma. Deposition is performed using continuous plasma. Void free Cu filling is achieved due to improved Cu reflow capability. A thicker field barrier remains after deposition due to reduced damage. FIG. 4 illustrates the results of the continuous approach. A dielectric layer 91' has a barrier layer 93' deposited thereon. Copper 95' is deposited without voids. Reduced damage to the barrier layer 93' (identified at 99') occurs. FIGS. 3 and 4 demonstrate improved ion reflow capability by continuous plasma.

In another example, reduced voids and damage to the barrier layer was also observed for a two-step continuous plasma process with 200-300 Angstroms deposited with an RF bias from 200-400 W and a second step with 75-125 Angstroms with an RF bias of 25-75 W.

As can be appreciated, while specific ranges and values are disclosed herein, other ranges and values may be used.

Figure 5:
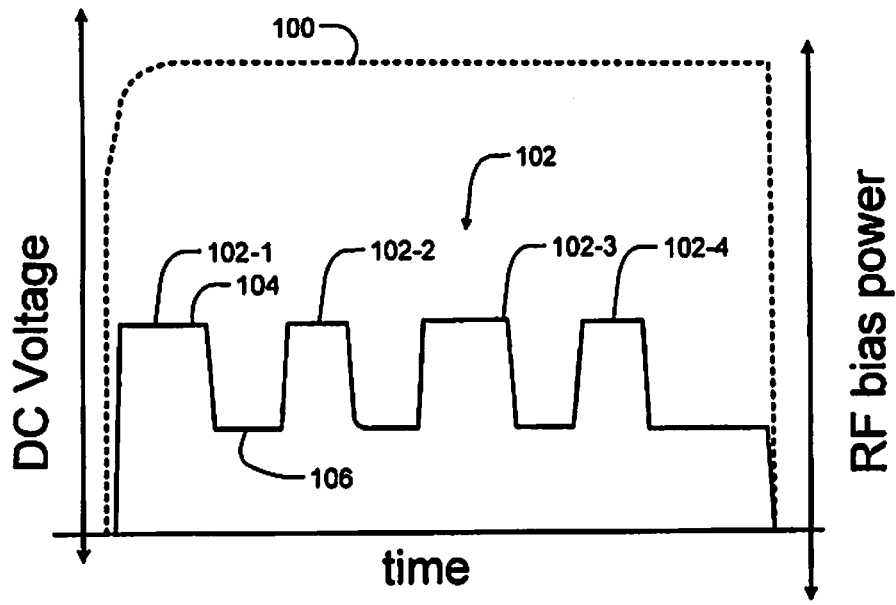
FIGS. 5-9B illustrate examples of DC voltage and RF power waveforms.

Referring now to FIGS. 5-9, various illustrative examples of DC voltage and RF bias power are shown. In FIG. 5, DC voltage 100 is initially turned on. The RF bias is generally identified at 102 and includes a plurality of square wave pulses 102-1, 102-2, 102-3, and 102-4 (collectively pulses 102). The number of pulses may be varied. In this example, the pulses 102 transition between two or more nonzero power values 104 and 106 (or between one or more non-zero values and zero). One or more of the pulses 102 may have a period or magnitude that is different than others of the pulses 102.

Figure 6:
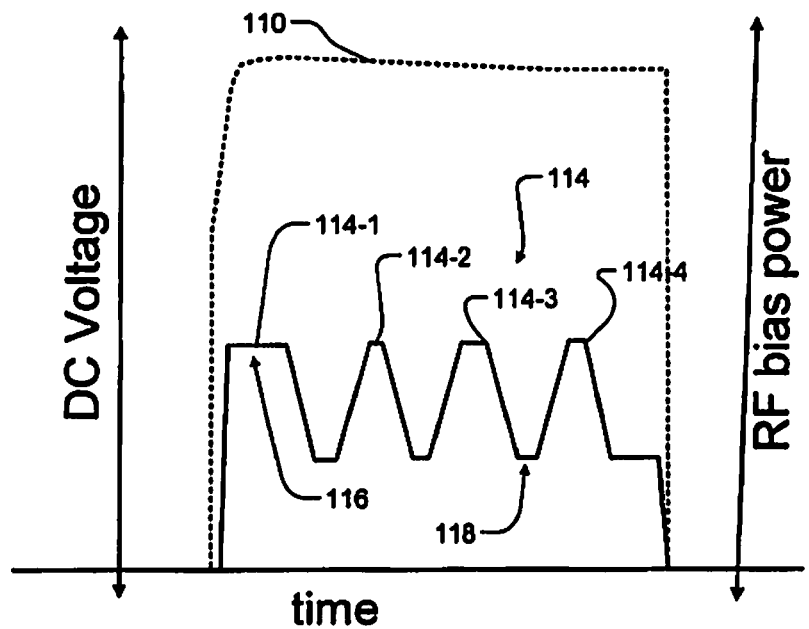

In FIG. 6, DC voltage 110 is initially turned on to strike plasma. The RF bias is generally identified at 114 and includes a plurality of triangular pulses 114-1, 114-2, 114-3, and 114-4 (collectively pulses 114). In this example, the pulses 114 transition between two or more nonzero power values 116 and 118 (or between one or more non-zero values and zero). However, each pulse 114 may have a different high or low magnitude. One or more of the pulses 114 may have a period, a leading edge slope, a trailing edge slope, or a high or low period that has a different value than others of the pulses. The number of pulses may be varied. In this example, the pulse 114-1 has a duration at a maximum power value that is longer than others of the pulses 114.

Figure 7:
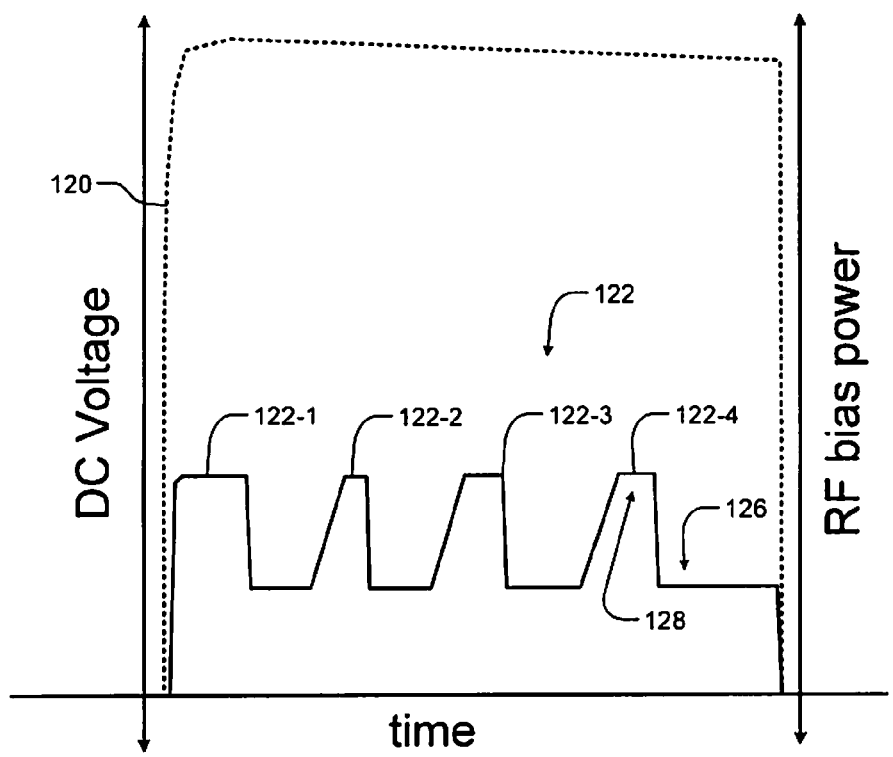

In FIG. 7, DC voltage 120 is initially turned on to strike plasma. The RF bias is generally identified at 122 and includes a plurality of saw tooth pulses 122-1, 122-2, 122-3, and 122-4 (collectively pulses 122). The number of pulses may be varied. In this example, the pulses 122 transition between two or more nonzero power values 126 and 128 (or between one or more non-zero values and zero). However, each pulse 122 may have a different high or low magnitude or period. One or more of the pulses 122 may have a period, a leading edge slope, a trailing edge slope, or a high or low period that has a different value than others of the pulses. In this example, the pulse 122-1 has a duration at a local maximum power value that is longer than others of the pulses 122.

Figure 8:
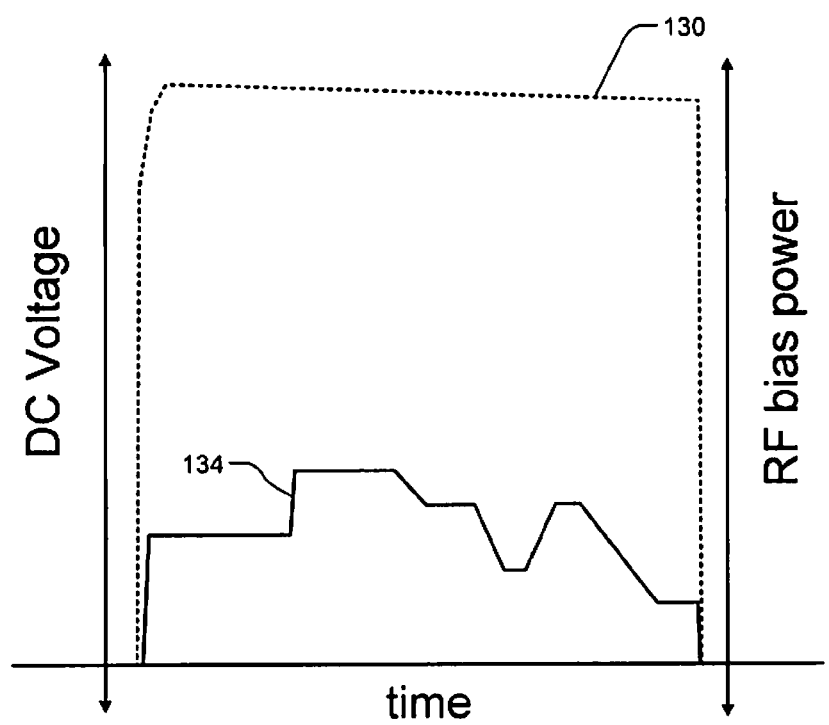
Figure 9A:
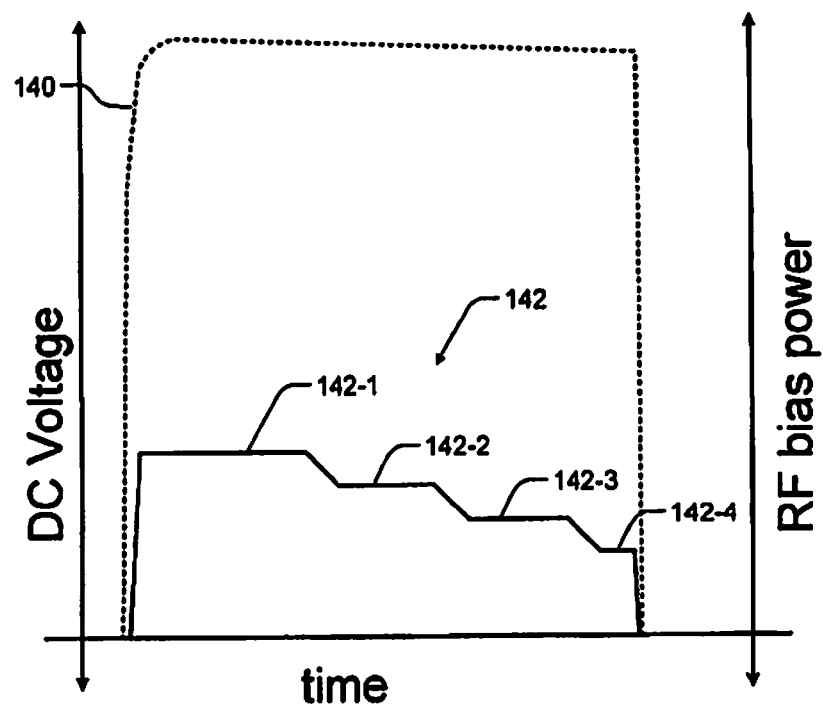
Figure 9B:
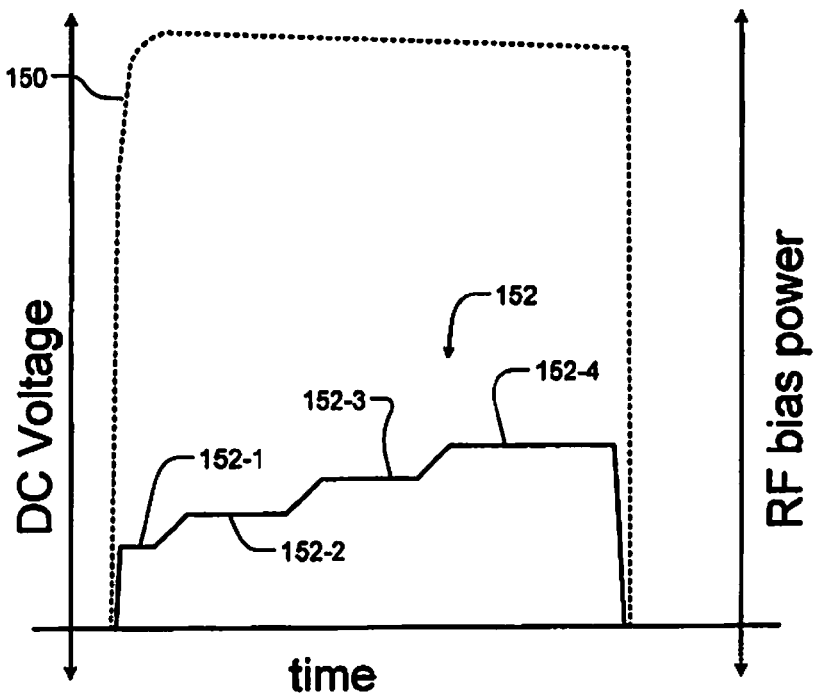

Various other RF bias power waveforms may be used. In FIG. 8, a DC voltage 130 and a RF bias power 134 is used. In FIG. 9A, a DC voltage 140 and an RF bias power waveform 142 are shown. The RF bias power waveform 142 includes steps 142-1, 142-2, 142-3, and 142-4 that monotonically decrease with time. In FIG. 9B, a DC voltage 150 and an RF bias power waveform 152 are shown. The RF bias power waveform 152 includes steps 152-1, 152-2, 152-3, and 152-4 that monotonically increase with time. The number of pulses may be varied. Still other DC voltage and RF bias power waveforms may be used.

Figure 10:
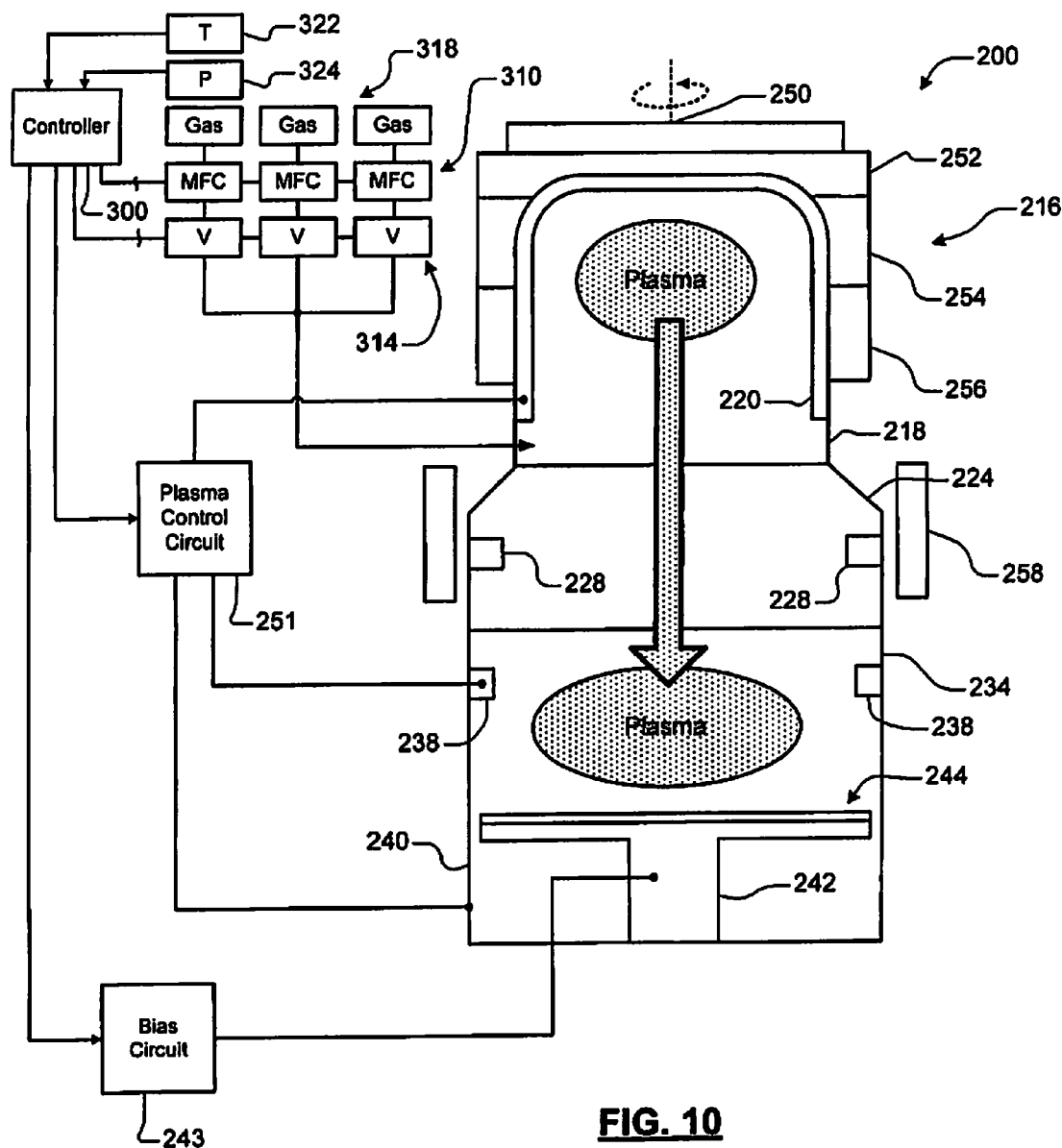
FIG. 10 illustrates an example of a PVD system including a controller.

Referring now to FIG. 10, an example of a physical vapor deposition (PVD) system 200 is shown. The PVD system 200 includes components such as a cathode 216 with a cathode target housing 218 and a cathode target 220. An anode 224 includes an anode ring 228, which is arranged adjacent to the cathode target 220. The PVD system 200 includes components such as an adapter 234 that is arranged adjacent to the anode 224 and includes an adapter ring 238. A pedestal 242 is arranged in a chamber 240. A substrate 244 such as a semiconductor wafer is arranged on the pedestal 242. Both direct current (DC) and/or radio frequency (RF) biases may be applied to the pedestal 242 by a bias circuit 243.

In use, process gas is supplied in the chamber 240 near the cathode target 220. A high voltage and vacuum is typically applied to the process gas to ionize the gas, which creates plasma (hereinafter plasma ignition). Magnets and/or electromagnets 250, 252, 254, and/or 256 may be provided to shape and concentrate the plasma as will be described below. The magnets 250 may be rotatable.

A plasma control circuit 251 supplies a voltage such as a negative DC voltage across the cathode target 220 and the adapter ring 238. The adapter ring 238 and the chamber 240 may be connected to chassis ground or another reference potential. In some examples, the anode ring 228 is allowed to float. In other words, the anode ring 228 is neither grounded nor biased.

In the example shown in FIG. 10, the cathode target 220 may have a cup-like shape to help concentrate the plasma, although other shapes may be used. For example only, the cathode target 220 may be made of aluminum, tantalum, or other suitable metal that is to be deposited onto the substrate 244. Magnetic fields may be produced by the magnets and/or electromagnets 250, 252, and/or 254. Additional magnets or electromagnets 258 may be arranged downstream of the cathode target 220 near the anode 224. The magnets or electromagnets produce a variable ion flux that may be used to control deposition, etch rate and/or uniformity.

The anode 224 and anode ring 228, which may be held at plasma floating potential, may also be used in conjunction with the magnets and/or electromagnets to shape the plasma distribution. Ion energy and an etch rate can be controlled by applying an RF bias to the pedestal 242. An additional function of the pedestal 242 may include wafer temperature control during deposition and sputtering.

A controller 300 may be used to control operation. The controller 300 is configured to control one or more mass flow controllers 310 and valves 314 to supply process gases 318 to the chamber. Sensors such as temperature sensors 322 and pressure sensors 324 may be arranged inside or outside of the chamber to provide temperature and pressure feedback. The controller 300 is configured to control the plasma control circuit 251, which controls turning the plasma on and off in the chamber as well as control parameters relating to the plasma. The controller 300 is configured to control the bias circuit 243 to start or stop the DC or RF bias and/or vary parameters of the DC or RF bias.

In some examples, when changing a process control parameter in one substrate processing step from one value to a different value in a subsequent substrate processing step, the process control parameter may be changed by a non-trivial amount that is greater than or equal to 1%, 2%, 5%, 10%, 15%, 20% or more of the prior process control value. As described above, the variation may be from a non-zero value to zero or vice versa.

In this application, including the definitions below, the term controller may be replaced with the term circuit. The term controller may refer to, be part of, or include an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor (shared, dedicated, or group) that executes code; memory (shared, dedicated, or group) that stores code executed by a processor; other suitable hardware components that provide the described functionality; or a combination of some or all of the above, such as in a system-on-chip.

The term code, as used above, may include software, firmware, and/or microcode, and may refer to programs, routines, functions, classes, and/or objects. The term shared processor encompasses a single processor that executes some or all code from multiple controllers. The term group processor encompasses a processor that, in combination with additional processors, executes some or all code from one or more controllers. The term shared memory encompasses a single memory that stores some or all code from multiple controllers. The term group memory encompasses a memory that, in combination with additional memories, stores some or all code from one or more controllers. The term memory may be a subset of the term computer-readable medium. The term computer-readable medium does not encompass transitory electrical and electromagnetic signals propagating through a medium, and may therefore be considered tangible and non-transitory. Non-limiting examples of a non-transitory tangible computer readable medium include nonvolatile memory, volatile memory, magnetic storage, and optical storage.

The apparatuses and methods described in this application may be partially or fully implemented by one or more computer programs executed by one or more processors. The computer programs include processor-executable instructions that are stored on at least one non-transitory tangible computer readable medium. The computer programs may also include and/or rely on stored data.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. For purposes of clarity, the same reference numbers will be used in the drawings to identify similar elements. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

What is claimed is:

1. A method for processing a substrate, comprising:
   (a) supplying process gas to a processing chamber including a substrate arranged on a pedestal;

(b) supplying a first DC voltage bias across first and second components of the processing chamber to create plasma in the processing chamber;
(c) supplying a radio frequency (RF) bias to the pedestal to provide a first etch to deposition (E/D) ratio, wherein the RF bias has a first frequency and a first power level;
(d) performing a first substrate processing step;
(e) after the first substrate processing step, maintaining the plasma in the processing chamber and at least one of:
  (e1) adjusting the first DC voltage bias to a second DC voltage bias that is different than the first DC voltage bias;
  (e2) adjusting the first frequency of the RF bias to a second frequency that is different than the first frequency; or
  (e3) adjusting the first power level of the RF bias to a second power level that is different than the first power level; and
(f) performing a second substrate processing step without an interruption in the plasma between the first substrate processing step and the second substrate processing step,
wherein the first and second substrate processing steps comprise ionized physical vapor deposition (iPVD), and wherein the iPVD comprises copper ion reflow.

2. The method of claim 1, wherein (e) includes (e1) and at least one of (e2) and (e3).

3. The method of claim 1, wherein the process gas comprises a first gas admixture supplied at a first flow rate and a first pressure.

4. The method of claim 3, further comprising during (e), at least one of:
adjusting the first gas admixture to a second gas admixture that is different than the first gas admixture;
adjusting the first flow rate to a second flow rate that is different than the first flow rate; or
adjusting the first pressure to a second pressure that is different than the first pressure.

5. The method of claim 1, further comprising during (e), adjusting the first E/D ratio to a second E/D ratio that is different than the first E/D ratio.

6. The method of claim 1, wherein a duration of the first substrate processing step is different than a duration of the second substrate processing step.

7. The method of claim 1, wherein (e) includes (e3) and wherein one of the first power level and the second power level is equal to zero and wherein the other of the first power level and the second power level is not equal to zero.

8. A method for processing a substrate, comprising:
(a) supplying process gas to a processing chamber including a substrate arranged on a pedestal, wherein the process gas comprises a first gas admixture supplied at a first flow rate and a first pressure;
(b) supplying a first DC voltage bias across first and second components of the processing chamber to create plasma in the processing chamber;
(c) performing a first substrate processing step;
(d) after the first substrate processing step, maintaining the plasma in the processing chamber and at least one of:
  (d1) adjusting the first DC voltage bias to a second DC voltage bias that is different than the first DC voltage bias;
  (d2) adjusting the first gas admixture to a second gas admixture that is different than the first gas admixture;
  (d3) adjusting the first flow rate to a second flow rate that is different than the first flow rate; or
  (d4) adjusting the first pressure to a second pressure that is different than the first pressure; and
(e) performing a second substrate processing step without an interruption in the plasma between the first substrate processing step and the second substrate processing step,
wherein the first and second substrate processing steps comprise ionized physical vapor deposition (iPVD), and wherein the iPVD comprises copper ion reflow.

9. The method of claim 8, wherein (d) includes (d1) and at least one of (d2), (d3) or (d4).

10. The method of claim 8, further comprising performing the first substrate processing step using a first etch to deposition (E/D) ratio.

11. The method of claim 10, further comprising during (d), adjusting the first E/D ratio to a second E/D ratio that is different than the first E/D ratio.

12. The method of claim 8, wherein a duration of the first substrate processing step is different than a duration of the second substrate processing step.

13. A method for processing a substrate, comprising:
(a) supplying process gas to a processing chamber including a substrate arranged on a pedestal, wherein the process gas comprises a first gas admixture supplied at a first flow rate and a first pressure;
(b) supplying a radio frequency (RF) bias to the pedestal, wherein the RF bias has a first frequency and a first power level;
(c) generating plasma in the processing chamber by applying a DC voltage across first and second components of the processing chamber;
(d) performing a first substrate processing step;
(e) after the first substrate processing step, maintaining the plasma in the processing chamber and at least one of:
  (e1) adjusting the first frequency of the RF bias to a second frequency that is different than the first frequency;
  (e2) adjusting the first power level of the RF bias to a second power level that is different than the first power level;
  (e3) adjusting the first gas admixture to a second gas admixture that is different than the first gas admixture;
  (e4) adjusting the first flow rate to a second flow rate that is different than the first flow rate; or
  (e5) adjusting the first pressure to a second pressure that is different than the first pressure; and
(f) performing a second substrate processing step without an interruption in the plasma between the first substrate processing step and the second substrate processing step,
wherein the first and second substrate processing steps comprise ionized physical vapor deposition (iPVD), and wherein the iPVD comprises copper ion reflow.

14. The method of claim 13, wherein (e) includes at least one of (e1) or (e2) and at least one of (e3), (e4) or (e5).

15. The method of claim 13, further comprising performing the first substrate processing step using a first etch to deposition (E/D) ratio.

16. The method of claim 15, further comprising during (e), further adjusting the first E/D ratio to a second E/D ratio that is different than the first E/D ratio.

17. The method of claim 13, wherein a duration of the first substrate processing step is different than a duration of the second substrate processing step.

18. The method of claim 13, wherein (e) includes (e2) and wherein one of the first power level and the second power level is equal to zero and wherein the other of the first power level and the second power level is not equal to zero.

19. A method for processing a substrate, comprising:
(a) supplying process gas to a processing chamber including a substrate arranged on a pedestal;
(b) supplying a first DC voltage bias across first and second components of the processing chamber to create plasma in the processing chamber;
(c) performing a first substrate processing step using a first etch to deposition (E/D) ratio;
(d) after the first substrate processing step, maintaining the plasma in the processing chamber and at least one of:
 (d1) adjusting the first DC voltage bias to a second DC voltage bias that is different than the first DC voltage bias; or
 (d2) adjusting the first E/D ratio to a second E/D ratio that is different than the first E/D ratio; and
(e) performing a second substrate processing step without an interruption in the plasma between the first substrate processing step and the second substrate processing step,
wherein the first and second substrate processing steps comprise ionized physical vapor deposition (iPVD), and wherein the iPVD comprises copper ion reflow.

20. The method of claim 19, wherein (d) includes both (d1) and (d2).

21. The method of claim 19, wherein a duration of the first substrate processing step is different than a duration of the second substrate processing step.

22. A method for processing a substrate, comprising:
(a) supplying process gas to a processing chamber including a substrate arranged on a pedestal, wherein the process gas comprises a gas admixture supplied at a first flow rate and a first pressure;
(b) supplying a radio frequency (RF) bias to the pedestal, wherein the RF bias has a first frequency and a first power level;
(c) generating plasma in the processing chamber by applying a DC voltage across first and second components of the processing chamber;
(d) performing a first substrate processing step using a first etch to deposition (E/D) ratio;
(e) after the first substrate processing step, maintaining the plasma in the processing chamber and at least one of:
 (e1) adjusting the first frequency of the RF bias to a second frequency that is different than the first frequency;
 (e2) adjusting the first power level of the RF bias to a second power level that is different than the first power level; or
 (e3) adjusting the first E/D ratio to a second E/D ratio that is different than the first E/D ratio; and
(f) performing a second substrate processing step without an interruption in the plasma between the first substrate processing step and the second substrate processing step,
wherein the first and second substrate processing steps comprise ionized physical vapor deposition (iPVD), and wherein the iPVD comprises copper ion reflow.

23. The method of claim 22, wherein (e) includes (e3) and at least one of (e1) or (e2).

24. The method of claim 22, wherein a duration of the first substrate processing step is different than a duration of the second substrate processing step.

25. The method of claim 22, wherein (e) includes (e2) and wherein one of the first power level and the second power level is equal to zero and wherein the other of the first power level and the second power level is not equal to zero.

26. The method of claim 1, wherein the components include a target and an adapter ring.

27. The method of claim 8, wherein the first and second components include a target and an adapter ring, respectively.

28. The method of claim 13, wherein the first and second components include a target and an adapter ring, respectively.

29. The method of claim 19, wherein the first and second components include a target and an adapter ring, respectively.

30. The method of claim 22, wherein the first and second components include a target and an adapter ring, respectively.

* * * * *